United States Patent
Kanda et al.

(10) Patent No.: US 10,651,301 B2
(45) Date of Patent: May 12, 2020

(54) SEMICONDUCTOR DEVICE AND METHOD OF MANUFACTURING THE SAME

(71) Applicant: Renesas Electronics Corporation, Koutou-ku, Tokyo (JP)

(72) Inventors: Ryo Kanda, Tokyo (JP); Hitoshi Matsuura, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/980,635

(22) Filed: May 15, 2018

(65) Prior Publication Data
US 2019/0006496 A1    Jan. 3, 2019

(30) Foreign Application Priority Data
Jun. 30, 2017   (JP) .................................. 2017-128398

(51) Int. Cl.
*H01L 29/66* (2006.01)
*H01L 29/06* (2006.01)
(Continued)

(52) U.S. Cl.
CPC ...... *H01L 29/7397* (2013.01); *H01L 29/0623* (2013.01); *H01L 29/0804* (2013.01);
(Continued)

(58) Field of Classification Search
CPC . H01L 29/0696; H01L 29/08; H01L 29/0821; H01L 29/083; H01L 29/7397;
(Continued)

(56) References Cited

U.S. PATENT DOCUMENTS 5,168,331 A * 12/1992 Yilmaz ............... H01L 29/0623
                                                257/331
7,737,491 B2    6/2010 Hotta et al.
(Continued)

FOREIGN PATENT DOCUMENTS

EP    2 942 816 A1    11/2015
JP     4723816 B2      7/2011
(Continued)

OTHER PUBLICATIONS

Extended European Search Report dated Oct. 31, 2018, in European Patent Application No. 18178690.6.

*Primary Examiner* — Natalia A Gondarenko
(74) *Attorney, Agent, or Firm* — SGPatents PLLC

(57) ABSTRACT

In one embodiment, a semiconductor device includes a semiconductor substrate having an upper surface, a trench electrode placed inside a trench formed on the upper surface, and a trench insulating film placed between the trench electrode and the semiconductor substrate, and the semiconductor substrate includes a drift layer, a floating layer for electric field reduction, a hole barrier layer, a body layer and an emitter layer, and the emitter layer, the body layer and the hole barrier layer are separated from the drift layer by the floating layer for electric field reduction, and a path of a carrier passing through an inverted layer formed in the body layer includes the body layer, the hole barrier layer, a non-inverted region of the floating layer for electric field reduction, and the drift layer.

6 Claims, 11 Drawing Sheets

(51) Int. Cl.
  *H01L 29/10*  (2006.01)
  *H01L 29/08*  (2006.01)
  *H01L 29/739* (2006.01)
  *H01L 29/78*  (2006.01)
  *H01L 29/40*  (2006.01)

(52) U.S. Cl.
  CPC ........ *H01L 29/1095* (2013.01); *H01L 29/407* (2013.01); *H01L 29/66348* (2013.01); *H01L 29/0619* (2013.01)

(58) Field of Classification Search
  CPC ............. H01L 29/0804; H01L 29/1095; H01L 29/0623; H01L 29/407; H01L 29/42304; H01L 29/42352; H01L 29/42356; H01L 29/4236; H01L 29/42364; H01L 29/66234; H01L 29/66295; H01L 29/66303; H01L 29/66333; H01L 29/66348; H01L 29/0619; H01L 29/7393; H01L 29/7395; H01L 29/7398; H01L 29/7396; H01L 21/8222; H01L 21/8224; H01L 21/8248; H01L 21/8249; H01L 29/0638; H01L 29/0634; H01L 21/265; H01L 21/324
  USPC ....... 257/139, 488, 495, 490, 492, 493, 496, 257/76, 77; 438/478, 425, 433
  See application file for complete search history.

(56) References Cited

U.S. PATENT DOCUMENTS

| | | | |
|---|---|---|---|
| 7,948,005 B2 | 5/2011 | Mori et al. | |
| 8,614,483 B2 | 12/2013 | Tanabe et al. | |
| 9,496,378 B2* | 11/2016 | Tang | H01L 29/7397 |
| 2011/0233684 A1* | 9/2011 | Matsushita | H01L 29/1095 |
| | | | 257/378 |
| 2014/0054644 A1 | 2/2014 | Hikasa | |
| 2017/0018637 A1* | 1/2017 | Kitamura | H01L 29/7397 |
| 2017/0025522 A1 | 1/2017 | Naito | |

FOREIGN PATENT DOCUMENTS

| | | |
|---|---|---|
| JP | 5698302 B2 | 4/2015 |
| JP | 5831598 B2 | 9/2015 |

\* cited by examiner

SEMICONDUCTOR DEVICE AND METHOD OF MANUFACTURING THE SAME

CROSS-REFERENCE TO RELATED APPLICATIONS

This application is based upon and claims the benefit of priority from Japanese patent application No. 2017-128398, filed on Jun. 30, 2017, the disclosure of which is incorporated herein in its entirety by reference.

BACKGROUND

The present invention relates to a semiconductor device and a method of manufacturing the same and, for example, relates to a semiconductor device including an IGBT (Insulated Gate Bipolar Transistor) having a trench-gate structure and a method of manufacturing the same.

One method to reduce the saturation voltage Vce(sat) of an IGBT is, for example, to form an N type hole barrier layer immediately below a P type body layer. In such a structure, holes are less likely to be injected into an emitter electrode, which enhances the carrier density. It is thereby possible to reduce the saturation voltage Vce(sat).

SUMMARY

As shown in FIG. 19, in an IGBT where an N− Type drift layer 10, an N type hole barrier layer 11, a P type body layer 12 and an N+ type emitter layer 13 are stacked sequentially between trench electrodes 22 formed inside trenches 20 with a trench insulating film 21 interposed therebetween, the saturation voltage Vce(sat) can be reduced by increasing the impurity concentration of the hole barrier layer 11 formed immediately below the P type body layer 12. However, this increases the strength of the electric field at the interface between the body layer 12 and the hole barrier layer 11, and reduces the collector-emitter withstand voltage.

The other problems and novel features of the present invention will become apparent from the description of the present specification and the accompanying drawings.

According to one embodiment, a semiconductor device includes a semiconductor substrate having an upper surface, a trench electrode placed inside a trench formed on the upper surface, and a trench insulating film placed between the trench electrode and the semiconductor substrate, wherein the semiconductor substrate includes a first semiconductor layer of a first conductivity type, a floating layer of a second conductivity type placed on the first semiconductor layer and where a lower end of the trench electrode reaches, a barrier layer of the first conductivity type placed on the floating layer and being in contact with the trench insulating film, a second semiconductor layer of the second conductivity type placed on the barrier layer and being in contact with the trench insulating film, and a third semiconductor layer of the first conductivity type placed on the second semiconductor layer, the third semiconductor layer, the second semiconductor layer and the barrier layer are separated from the first semiconductor layer by the floating layer, and a path of a carrier passing through an inverted layer formed in the second semiconductor layer includes the second semiconductor layer, the barrier layer, a non-inverted region of the floating layer, and the first semiconductor layer, According to the one embodiment described above, it is possible to provide a semiconductor device and a method of manufacturing the same, which achieve reduction of the saturation voltage Vce(sat).

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

The following description and the attached drawings are appropriately shortened and simplified to clarify the explanation. In the figures, the identical reference symbols denote identical structural elements and the redundant explanation thereof is omitted.

First Embodiment: Structure

Figure 1:
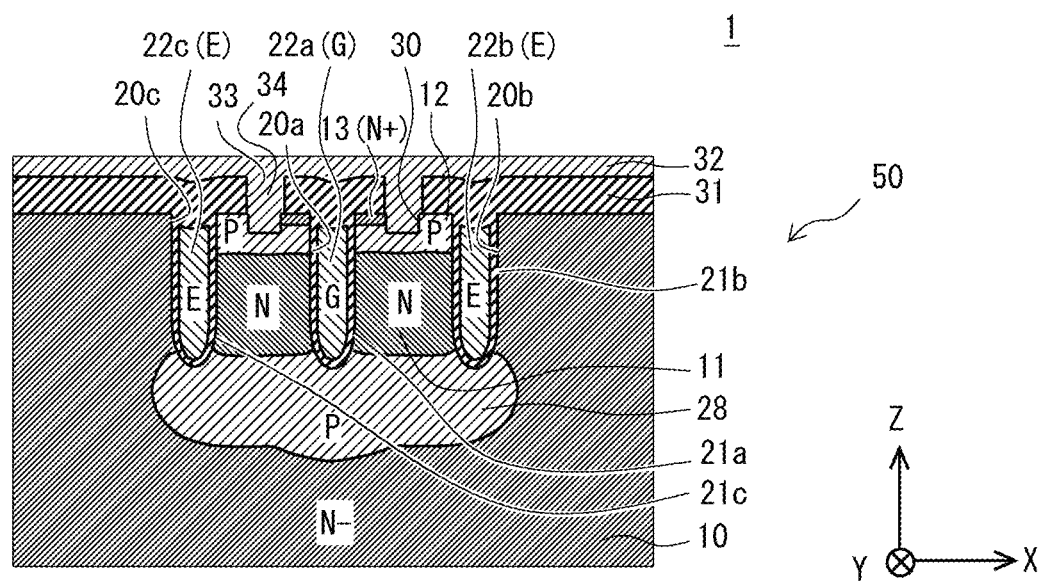
FIG. 1 is a cross-sectional view illustrating a semiconductor device according to a first embodiment.

A semiconductor device and a method of manufacturing a semiconductor device according to the first embodiment are described hereinafter. First, the structure of the semiconductor device according to the first embodiment is described. FIG. 1 is a cross-sectional view illustrating the semiconductor device according to the first embodiment.

As shown in FIG. 1, a semiconductor device 1 includes a semiconductor substrate 50. The semiconductor substrate 50 includes a drift layer 10, a floating layer 28 for electric field reduction, a hole barrier layer 11, a body layer 12, and an emitter layer 13. The semiconductor substrate 50 is, for example, a silicon substrate containing silicon. Note that since the semiconductor substrate 50 is not limited to being a substrate containing silicon, it may instead contain another semiconductor material. The principal surface of the semiconductor substrate 50 is referred to as an upper surface. The semiconductor substrate 50 has an upper surface. The drift layer 10 is also referred to as a first semiconductor layer. The body layer 12 is also referred to as a second semiconductor layer. The emitter layer 13 is also referred to as a third semiconductor layer. The floating layer 28 for electric field reduction is also referred to as a floating layer. The hole barrier layer 11 is also referred to as a barrier layer.

A trench 20 (20a, 20b and 20c; hereinafter referred to as 20a to 20c) is formed on the upper surface of the semiconductor substrate 50. Although a plurality of the trenches 20a to 20c are formed in the figure, the trench 20 is a collective term, which is not limited to any one of the trenches 20a to 20c.

The trench 20 extends in one direction in a plane parallel to the upper surface of the semiconductor substrate 50. A plurality of the trenches 20 that extend in one direction may be placed on the upper surface of the semiconductor substrate 50. The plurality of the trenches 20 are arranged side by side along one direction which is orthogonal to another direction in a plane parallel to the upper surface of the semiconductor substrate 50.

To describe the semiconductor device 1, the XYZ-orthogonal coordinate axis system is used. The direction which is orthogonal to the upper surface of the semiconductor substrate 50 is a Z axis direction. For the sake of convenience, +Z axis direction is referred to as upward, and −Z axis direction is referred to as downward. Note that each direction and upward and downward directions in the XYZ-orthogonal coordinate axis system are directions merely for making it easier to describe the semiconductor device 1, and the upper surface of the semiconductor substrate 50 is thus not limited to facing the +Z axis direction and upward when using the semiconductor device 1. One direction in a plane parallel to the upper surface of the semiconductor substrate 50 is a Y axis direction. Thus, one direction in which the trench 20 extends is the Y axis direction. The other direction which is orthogonal to one direction in a plane parallel to the upper surface of the semiconductor substrate 50 is an X axis direction. The plurality of trenches 20 are formed side by side in the X axis direction.

Among the plurality of trenches 20, the trench 20 that is placed between the trenches 20 in the other direction, which is the X axis direction, is referred to as a trench 20a. The trenches 20 on one side and on the other side of the trench 20a, which are the trenches 20 on the +X axis direction side and on the −X axis direction side of the trench 20a, are referred to as a trench 20b and a trench 20c.

A trench insulating film 21 (21a, 21b and 21c; hereinafter referred to as 21a to 21c) is formed inside the trench 20. Although a plurality of trench insulating films 21a to 21c are formed in the figure, the trench insulating film 21 is a collective term, which is not limited to any one of the trench insulating films 21a to 21c.

The trench insulating film 21 contains a silicon oxide film, for example, as a material. Note that the trench insulating film 21 may contain an insulating film other than a silicon oxide film. The trench insulating film 21 formed on the inner surface of the trench 20a is referred to as a trench insulating film 21a. The trench insulating film 21 formed on the inner surface of the trench 20b is referred to as a trench insulating film 21b. The trench insulating film 21 formed on the inner surface of the trench 20c is referred to as a trench insulating film 21c.

A trench electrode 22 (22a, 22b and 22c; hereinafter referred to as 22a to 22c) is placed inside the trench 20 that is formed on the upper surface of the semiconductor substrate 50. Although a plurality of trench electrodes 22a to 22c are formed in the figure, the trench electrode 22 is a collective term, which is not limited to any one of the trench electrodes 22a to 22c.

The trench electrode 22 is formed inside the trench 20 with the trench insulating film 21 interposed therebetween. Thus, the trench insulating film 21 is placed between the trench electrode 22 and the semiconductor substrate 50. The trench electrode 22 contains, for example, polysilicon as a conducting material. Therefore, the trench electrode 22 is formed by embedding a conducting material inside the trench 20.

The trench electrode 22 extends in one direction, which is the Y axis direction, just like the trench 20. A plurality of trench electrodes 22 may be placed in a plurality of the trenches 20 by embedding a conducting material inside the plurality of trenches 20. In the case where the plurality of trench electrodes 22 are placed in the plurality of the trenches 20, these trench electrodes 22 are arranged side by side along the other direction, which is the X axis direction. The trench electrode 22 that is formed inside the trench 20a is referred to as a trench electrode 22a. The trench electrode 22 that is formed inside the trench 20b is referred to as a trench electrode 22b. The trench electrode 22 that is formed inside the trench 20c is referred to as a trench electrode 22c.

A contact groove 30 is made on the upper surface of the semiconductor substrate 50. The contact groove 30 is made to extend in one direction, which is the Y axis direction, in a plane parallel to the upper surface of the semiconductor substrate 50. The contact groove 30 is arranged side by side with the trench 20. In the case where a plurality of trenches 20 are formed, the contact groove 30 is placed, for example, between the adjacent trenches 20. For example, the contact groove 30 is placed between the trench 20a and the trench 20b and between the trench 20a and the trench 20c. The length of the contact groove 30 is shorter than the length of the trench 20 in the Z axis direction. In other words, the depth of the contact groove 30 is smaller than the depth of the trench 20.

As shown in FIG. 1, the semiconductor substrate 50 between the adjacent trench electrodes 22 includes the floating layer 28 for electric field reduction, the hole barrier layer 11, the body layer 12 and the emitter layer 13. The drift layer 10 is placed below the floating layer 28 for electric field reduction.

The drift layer 10 is an N− type semiconductor layer into which N type impurities with, for example, a low impurity concentration are doped.

For the sake of convenience, N type, N− type and N+ type semiconductor layers are referred to as a first conductivity type semiconductor layer, and P type, P− type and P+ type semiconductor layers are referred to as a second conductivity type semiconductor layer. Note that N type, N− type and N+ type semiconductor layers may be referred to as a second conductivity type semiconductor layer, and P type, P− type and P+ type semiconductor layers may be referred to as a first conductivity type semiconductor layer. Further, when N type impurities are doped with a low impurity concentration, it is the N− type semiconductor layer, when N type impurities are doped with a high impurity concentration, it is the N+ type semiconductor layer, and when N type impurities are doped with an impurity concentration which is higher than the low impurity concentration and lower than the high impurity concentration, it is the N type semiconductor layer. Likewise, when P type impurities are doped with a low impurity concentration, it is the P− type semiconductor layer, when P type impurities are doped with a high impurity concentration, it is the P+ type semiconductor layer, and when P type impurities are doped with an impurity concentration which is higher than the low impurity concentration and lower than the high impurity concentration, it is the P type semiconductor layer.

The floating layer 28 for electric field reduction is placed on the drift layer 10. Note that the side surface of the floating layer 28 for electric field reduction may be covered with the drift layer 10, and a part of the upper surface of the floating layer 28 for electric field reduction may be covered with the drift layer 10.

The floating layer 28 for electric field reduction covers the lower end of the trench 20. Thus, the lower end of the trench electrode 22 is covered with the floating layer 28 for electric field reduction with the trench insulating film 21 interposed therebetween. The lower end of the trench 20 and the lower end of the trench electrode 22 reach the floating layer 28 for electric field reduction. The floating layer 28 for electric field reduction is in contact with the trench insulating film 21. The floating layer 28 for electric field reduction is a P type semiconductor layer into which P type impurities are doped. For example, the impurity concentration of the floating layer 28 for electric field reduction may be equal to or lower than $1 \times 10^{16}/cm^3$. The impurity concentration of the floating layer 28 for electric field reduction may be lower than the impurity concentration of the body layer 12.

In the case where a plurality of trenches 20 are formed, and a plurality of trench electrodes 22 are placed therein, the floating layer 28 for electric field reduction is placed along the lower ends of the plurality of trench electrodes 22 so as to cover the lower ends of the plurality of trenches 20 and the lower ends of the plurality of trench electrodes 22. The floating layer 28 for electric field reduction covers the lower ends of the plurality of trench electrodes 22 in a continuous manner. Thus, the floating layer 28 for electric field reduction that covers the lower ends of the adjacent trench electrodes 22 separates a part between the adjacent trench electrodes 22 from a part below the floating layer 28 for electric field reduction.

The hole barrier layer 11 is placed on the floating layer 28 for electric field reduction. The hole barrier layer 11 is in contact with the trench insulating film 21 that is placed on the side surface of the trench 20. The floating layer 28 for electric field reduction is placed between the hole barrier layer 11 and the drift layer 10. The hole barrier layer 11 is separated from the drift layer 10 by the floating layer 28 for electric field reduction. The hole barrier layer 11 is an N type semiconductor layer into which N type impurities are doped, for example. For example, the impurity concentration of the hole barrier layer 11 may be as high as $1 \times 10^{17}$ to $1 \times 10^{18}/cm^3$. Further, the impurity concentration of the hole barrier layer 11 may be higher than the impurity concentration of the drift layer 10. Note that the impurity concentration of the hole barrier layer 11 may be about $1 \times 10^{16}/cm^3$. The hole barrier layer 11 is referred to also as a barrier layer.

In the case where a plurality of trenches 20 are formed, and a plurality of trench electrodes 22 are placed therein, the hole barrier layer 11 is placed between the adjacent trenches 20. The lower surface of the hole barrier layer 11 is covered with the floating layer 28 for electric field reduction.

The body layer 12 is placed above the hole barrier layer 11. The body layer 12 is in contact with the trench insulating film 21 that is placed on the side surface of the trench 20. The body layer 12 is a P type semiconductor layer into which P type impurities are doped, for example. The impurity concentration of the body layer 12 may be higher than the impurity concentration of the floating layer 28 for electric field reduction.

The lower end of the contact groove 30 is located in the body layer 12. The lower surface of the body layer 12 is in contact with the hole barrier layer 11. The hole barrier layer 11 and the floating layer 28 for electric field reduction are placed between the body layer 12 and the drift layer 10. The hole barrier layer 11 is placed between the body layer 12 and the floating layer 28 for electric field reduction. Thus, the body layer 12 is separated from the floating layer 28 for electric field reduction by the hole barrier layer 11. In the case where a plurality of trenches 20 are formed, and a plurality of trench electrodes 22 are placed therein, the body layer 12 is placed between the adjacent trenches 20. The lower surface of the body layer 12 is covered with the hole barrier layer 11.

The emitter layer 13 is placed on the body layer 12. The emitter layer 13 may be in contact with the trench insulating film 21 that is placed on the side surface of the trench 20. For example, the emitter layer 13 is in contact with the trench insulating film 21a that is placed on the side surface of the trench 20a. Further, the emitter layer 13 is placed between the trench 20 and the contact groove 30 adjacent to the trench 20. For example, the emitter layer 13 is placed between the trench 20a and the contact groove 30. The emitter layer 13 is an N+ type semiconductor layer into which N type impurities are doped with high concentration, for example.

In the semiconductor device 1, the emitter layer 13, the body layer 12 and the hole barrier layer 11 are separated from the drift layer 10 by the floating layer 28 for electric field reduction.

In the case where a plurality of trench electrodes 22 are placed, the emitter layer 13, the body layer 12 and the hole barrier layer 11 are placed between the adjacent trench electrodes 22. The floating layer 28 for electric field reduction is placed along the lower ends of the adjacent trench electrodes 22.

As shown in FIG. 1, in the case where the trench electrode 22b and the trench electrode 22c are placed on both sides of the trench electrode 22a in the X axis direction, the hole barrier layer 11, the body layer 12 and the emitter layer 13 are placed between the trench electrode 22a and the trench electrode 22b. Likewise, the hole barrier layer 11, the body layer 12 and the emitter layer 13 are placed between the trench electrode 22a and the trench electrode 22c. The floating layer 28 for electric field reduction is placed along the lower ends of the trench electrode 22b, the trench electrode 22a and the trench electrode 22c.

The side of the trench electrode 22b in the +X axis direction and the side of the trench electrode 22c in the −X axis direction are covered with the drift layer 10. In other words, the drift layer 10 serves as a part of the upper surface of the semiconductor substrate 50 in the +X axis direction side of the trench electrode 22b and in the −X axis direction side of the trench electrode 22c.

In addition to the semiconductor substrate 50, the trench insulating film 21 and the trench electrode 22, the semiconductor device 1 may include an inter-layer insulating layer 31, an emitter line layer 32, a field stop layer, a collector layer and a collector line layer.

The inter-layer insulating layer 31 is placed on the semiconductor substrate 50 and the trench electrode 22. The inter-layer insulating layer 31 is placed on the drift layer 10, the body layer 12 and the emitter layer 13 in the semiconductor substrate 50. The inter-layer insulating layer 31 has a through groove 33. The through groove 33 runs through the inter-layer insulating layer 31. The through groove 33 communicates with the contact groove 30. The inter-layer insulating layer 31 contains a silicon oxide film, for example, as an insulating material. Note that the inter-layer insulating layer 31 may contain an insulating material other than a silicon oxide film.

The emitter line layer 32 is placed on the inter-layer insulating layer 31. The emitter line layer 32 is connected to the body layer 12 through a contact 34. The contact 34 is placed inside the through groove 33 that runs through the inter-layer insulating layer 31 and inside the contact groove 30 made in the body layer 12. Thus, the lower end of the contact 34 is located lower than the upper end of the body layer 12. Further, a contact layer may be placed between the contact 34 and the body layer 12. The contact layer is a P+ type semiconductor layer into which P type impurities are doped with high concentration, for example.

The emitter line layer 32 and the contact 34 contain aluminum (Al), for example, as a conducting material. Note that the emitter line layer 32 and the contact 34 may contain a conducting material other than aluminum. Further, a barrier metal may be placed between the emitter line layer 32 and the contact 34, and the inter-layer insulating layer 31 and the body layer 12.

A field stop layer, which is not shown, may be placed below the drift layer 10. The field stop layer is an N type semiconductor layer into which N type impurities are doped, for example. A collector layer, which is not shown, may be placed below the field stop layer. The collector layer is a P type semiconductor layer into which P type impurities are doped, for example. A collector line layer may be placed below the collector layer. The collector line layer contains aluminum (Al), for example, as a conducting material. Note that the collector line layer may contain a conducting material other than aluminum.

First Embodiment: Operation

The operation of the semiconductor device 1 according to this embodiment is described hereinafter.

Figure 2:
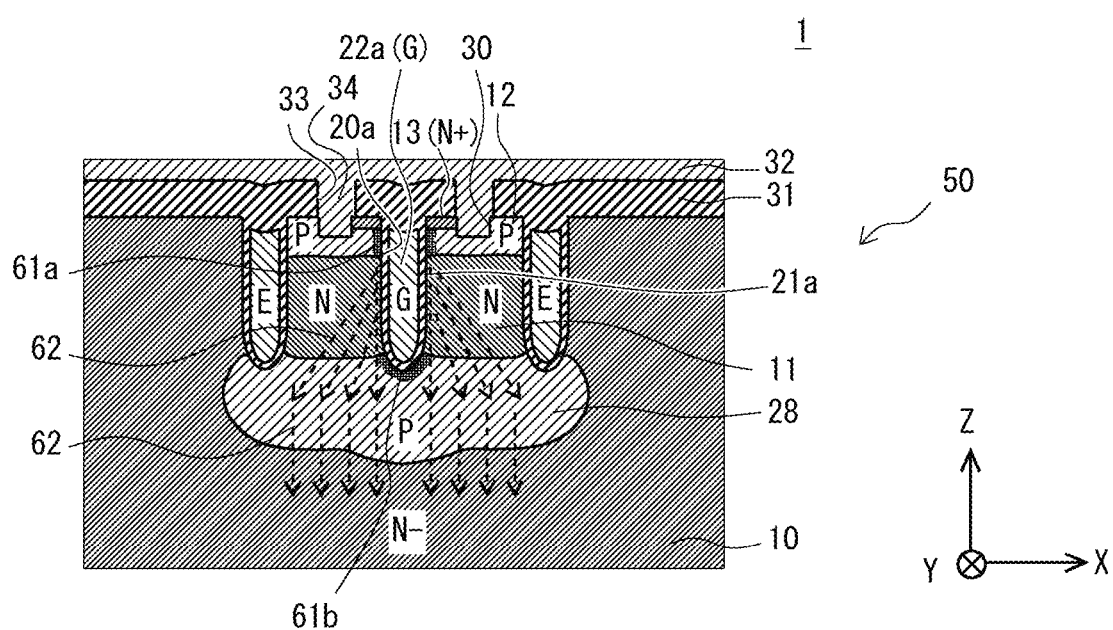
FIG. 2 is a view illustrating a carrier path of the semiconductor device according to the first embodiment.
Figure 3:
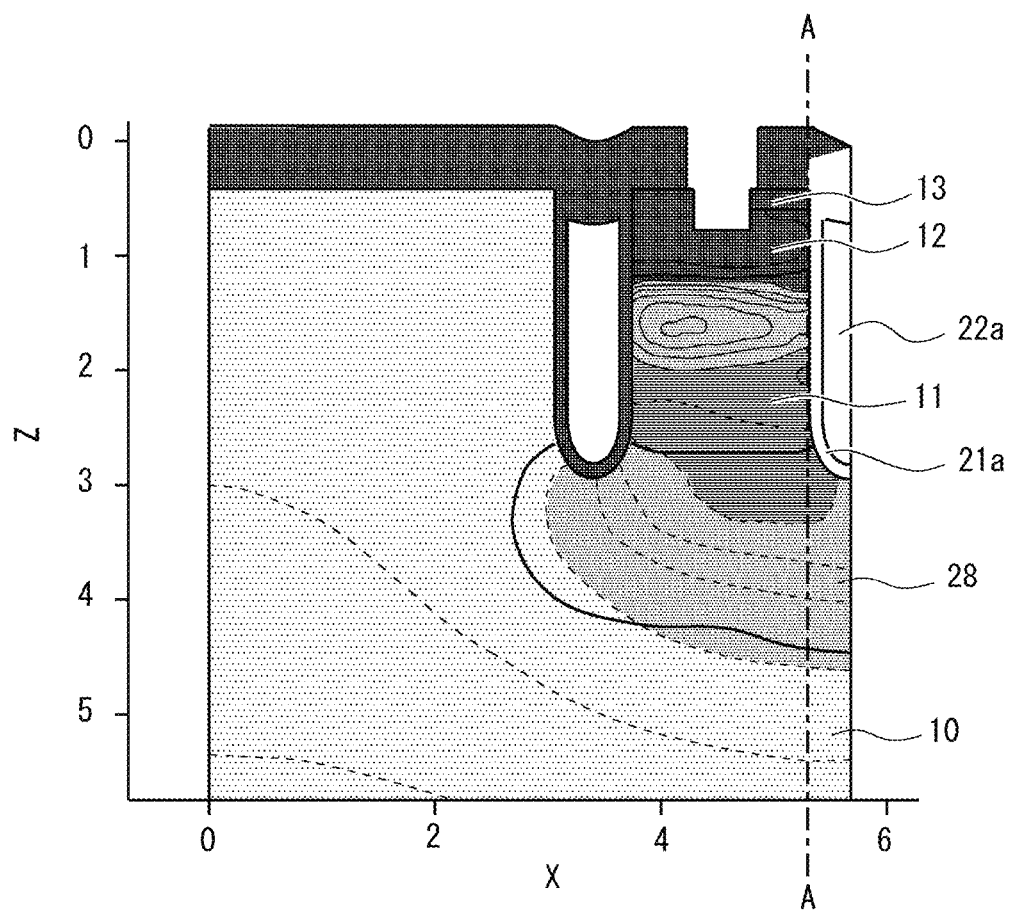
FIG. 3 is a view illustrating the electric potential distribution in the on-state of the semiconductor device according to the first embodiment.
Figure 4:
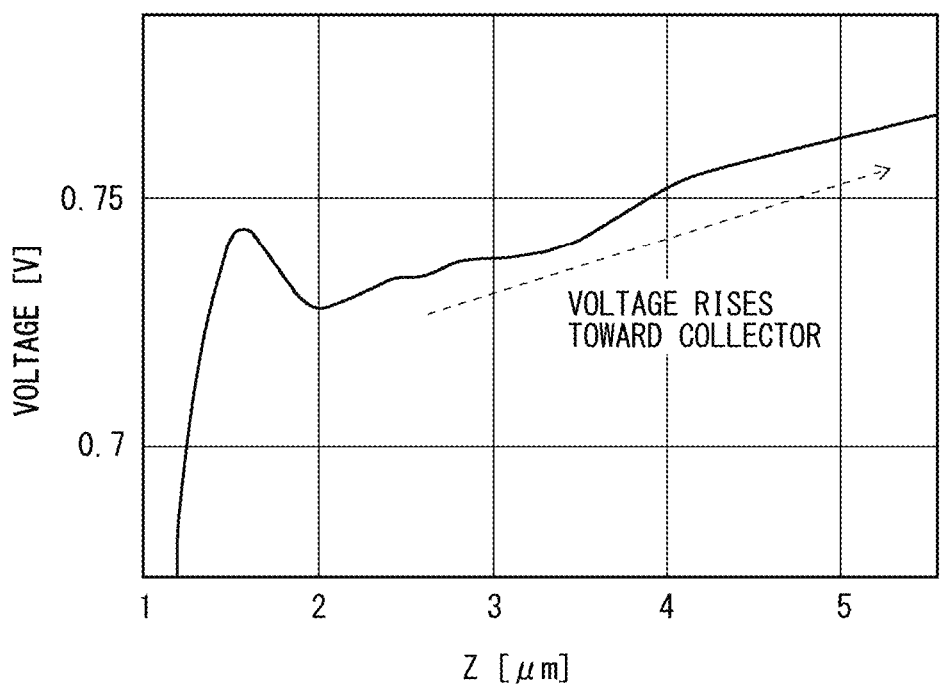
FIG. 4 is a graph illustrating the electric potential distribution in the on-state of the semiconductor device according to the first embodiment.

FIG. 2 is a view illustrating a carrier path of the semiconductor device according to the first embodiment. FIG. 3 is a view illustrating the electric potential distribution in the on-state of the semiconductor device according to the first embodiment, and the electric potential distribution is shown using contour lines and shading. FIG. 4 is a graph illustrating the electric potential distribution in the on-state of the semiconductor device according to the first embodiment, and it shows the distribution of electric potentials in the Z axis direction along the line A-A in FIG. 3. As shown in FIG. 2, by applying a positive voltage to the trench electrode 22a, an inverted region 61a, which serves as a channel, is formed in the body layer 12 in close proximity to the trench insulating film 21a. In this manner, the trench electrode 22a has the function of a gate electrode, and the trench insulating film 21a has the function of a gate insulating film. An inverted region 61b is also formed in the floating layer 28 for electric field reduction in close proximity to the trench insulating film 21a. Note that the inverted regions 61a and 61b referred to also as inverted layers. Further, a region other than the inverted regions 61a and 61b is referred to as a non-inverted region. The body layer 12 includes the inverted region 61a and the non-inverted region. The floating layer 28 for electric field reduction includes the inverted region 61b and the non-inverted region.

In the semiconductor device 1 according to this embodiment, the body layer 12 is formed below the emitter layer 13 so that it is in contact with the trench insulating film 21a. Thus, the inverted region 61a is formed in the body layer 12 that is in contact with the trench insulating film 21a below the emitter layer 13. Accordingly, when the semiconductor device 1 turns to a conducting state (ON state), a carrier 62 that is output from the emitter layer 13 moves in the −Z axis direction from the emitter layer 13 toward the body layer 12 immediately below the emitter layer 13. The carrier 62 is electrons, for example.

The electrons that have moved in the −Z axis direction from the emitter layer 13 and reached the inverted region 61a then move downward along the inverted region 61a and reach the hole barrier layer 11. The electrons that have reached the hole barrier layer 11 move downward through the hole barrier layer 11 along the trench insulating film 21a and then reach the floating layer 28 for electric field reduction. Further, the electrons that have reached the hole barrier layer 11 may spread to some extent to move away from the trench insulating film 21a and then reach the floating layer 28 for electric field reduction. Note that the floating layer 28 for electric field reduction is included in the channel current path.

However, in this embodiment, the impurity concentration of the floating layer 28 for electric field reduction is suppressed to be lower than a specified concentration level. An electric field is thereby formed vertically from the collector side to the emitter side. As shown in FIGS. 3 and 4, in the ON state, a voltage between the collector side and the emitter side rises toward the collector. Specifically, an electric field is formed vertically from the collector side to the emitter side. The electrons that have moved through the channel thereby flow toward the collector. Accordingly, the electrons that have reached the floating layer 28 for electric field reduction can reach the drift layer 10 by the formed electric field. At this time, the carrier 62 (electrons) passes through the non-inverted region of the floating layer 28 for electric field reduction. In this manner, the path of the carrier that passes through the inverted region 61a formed in the body layer 12 includes the body layer 12, the hole barrier layer 11, the non-inverted region of the floating layer 28 for electric field reduction, and the drift layer 10.

Further, by forming the floating layer 28 for electric field reduction immediately below the hole barrier layer 11, it is possible to reduce the strength of the electric field between the hole barrier layer 11 and the body layer 12. Further, the lower end of the trench 20 is covered with the floating layer 28 for electric field reduction. It is thereby possible to reduce the strength of the electric field at the lower end of the trench 20.

It is considered that, if the lower end of the trench 20 is covered with a P type semiconductor layer, the path of a channel is blocked, and the current by electrons ceases to flow. However, by lowering the concentration of impurities contained in the floating layer 28 for electric field reduction, the electrons can pass through it. Specifically, the carrier passes through the non-inverted region of the floating layer 28 for electric field reduction.

As shown in FIG. 1, a plurality of trench electrodes 22 are placed, and a gate voltage that forms an inverted layer in a part of the body layer 12 which is in contact with the trench insulating film 21a is applied to the trench electrode 22a. The trench electrode 22 to which a gate voltage is applied in this manner is referred to as a first trench electrode G.

On the other hand, an emitter voltage that establishes continuity between the drift layer 10 and the emitter layer 13 is applied to the trench electrode 22b and the trench electrode 22c. The trench electrode 22 to which an emitter voltage is applied in this manner is referred to as a second trench electrode E.

The semiconductor device 1 includes the first trench electrode G and the second trench electrodes E. The second trench electrodes E are placed on both of one side (+X axis direction side) and the other side (−X axis direction side) of the first trench electrode G, so that the first trench electrode G is placed between the second trench electrodes E.

The emitter layer 13, the body layer 12 and the hole barrier layer 11 are placed between the first trench electrode G and the second trench electrode E that are adjacent to each other. The floating layer 28 for electric field reduction is placed along the lower ends of the first trench electrode G and the second trench electrodes E placed on both sides of the first trench electrode.

First Embodiment: Manufacturing Method

Figure 5:
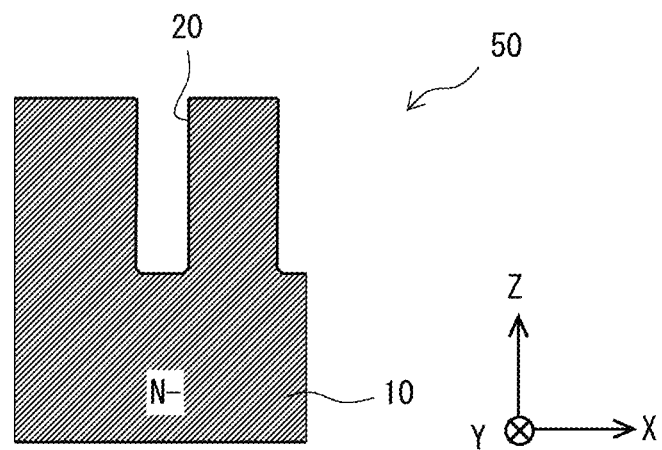
FIG. 5 is a process cross-sectional view illustrating a method of manufacturing the semiconductor device according to the first embodiment, and it shows a formation process of a trench.
Figure 6:
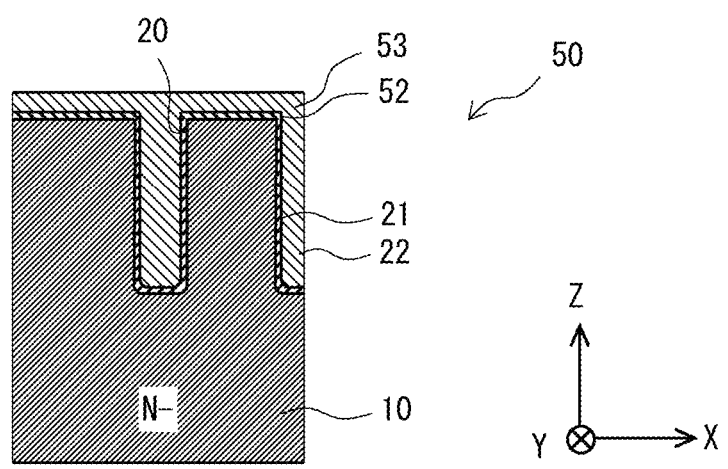
FIG. 6 is a process cross-sectional view illustrating a method of manufacturing the semiconductor device according to the first embodiment, and it shows a formation process of a trench insulating film and a deposition process of polysilicon for trench electrode formation.
Figure 7:
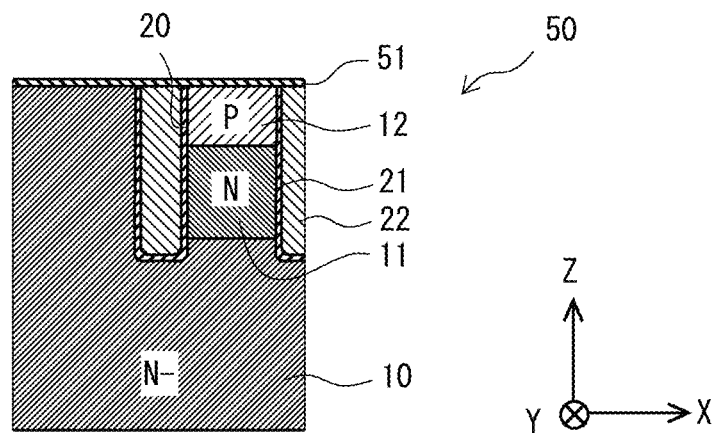
FIG. 7 is a process cross-sectional view illustrating a method of manufacturing the semiconductor device according to the first embodiment, and it shows an etchback process of polysilicon for trench electrode formation and a formation process of a body layer.
Figure 8:
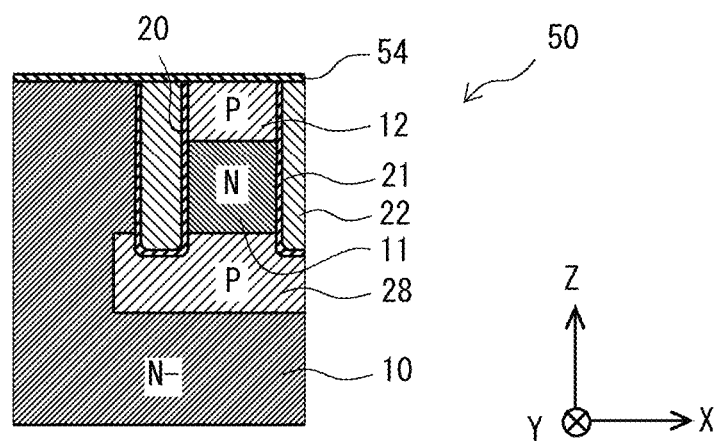
FIG. 8 is a process cross-sectional view illustrating a method of manufacturing the semiconductor device according to the first embodiment, and it shows a formation process of a hole barrier layer and a floating layer for electric field reduction.
Figure 9:
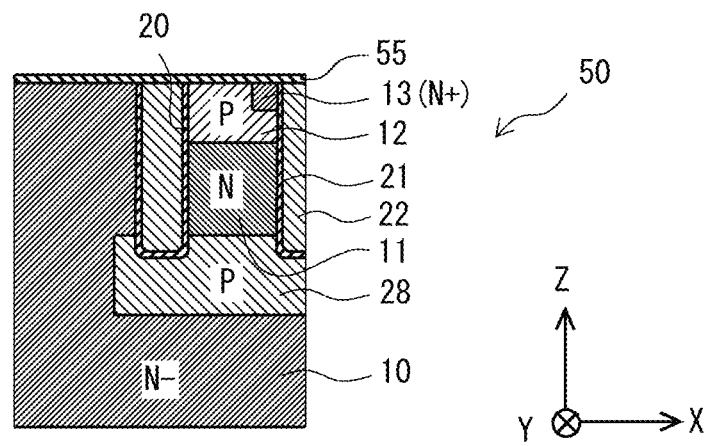
FIG. 9 is a process cross-sectional view illustrating a method of manufacturing the semiconductor device according to the first embodiment, and it shows a formation process of an emitter layer.
Figure 10:
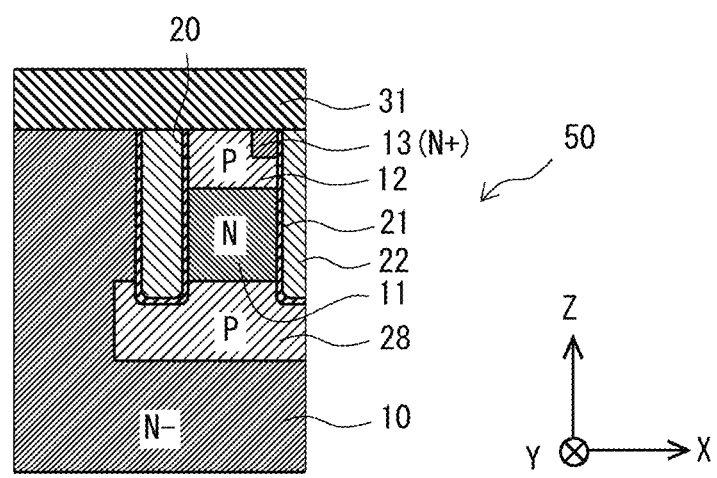
FIG. 10 is a process cross-sectional view illustrating a method of manufacturing the semiconductor device according to the first embodiment, and it shows a formation process of an inter-layer insulating layer.
Figure 11:
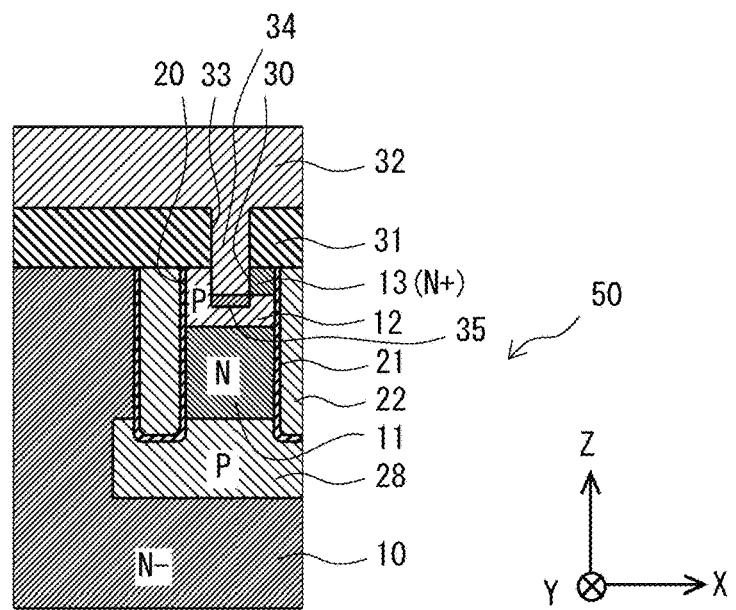
FIG. 11 is a process cross-sectional view illustrating a method of manufacturing the semiconductor device according to the first embodiment, and it shows a formation process of a contact groove, a through groove, and an emitter line layer.

A method of manufacturing the semiconductor device 1 according to this embodiment is described hereinafter. FIGS. 5 to 11 are process cross-sectional views illustrating the method of manufacturing the semiconductor device 1 according to the first embodiment, and FIG. 5 shows a formation process of the trench 20. FIG. 6 shows a formation process of the trench insulating film 21 and a deposition process of polysilicon for forming the trench electrode 22. FIG. 7 shows an etchback process of polysilicon for forming the trench electrode 22 and a formation process of the body layer 12. FIG. 8 shows a formation process of the hole barrier layer 11 and the floating layer 28 for electric field reduction. FIG. 9 shows a formation process of the emitter layer 13. FIG. 10 shows a formation process of the interlayer insulating layer 31. FIG. 11 shows a formation process of the contact groove 30, the through groove 33 and the emitter line layer 32.

As shown in FIG. 5, a N− type silicon single-crystal wafer, for example, is prepared first as the semiconductor substrate 50. For example, the semiconductor substrate 50 in which phosphorus is doped with low concentration as the impurity is prepared. The semiconductor substrate 50 includes the N− type drift layer 10. Note that the material of the semiconductor substrate 50 is not limited to silicon, and it may be another semiconductor. Then, the trench 20 is formed on the upper surface of the semiconductor substrate 50 by anisotropic dry etching, for example, by using a patterned hard mask film or the like, which is not shown.

The trench 20 is formed to extend in one direction in a plane parallel to the upper surface of the semiconductor substrate, which is the Y axis direction. A plurality of trenches 20 may be formed. After that, the hard mask film or the like is removed by wet etching, for example.

Next, as shown in FIG. 6, an insulating film 52 with a specified thickness is formed on the upper surface of the semiconductor substrate 50 and on the inner surface of the trench 20 by thermal oxidation or the like, for example. A part of the insulating film 52 which is formed on the inner surface of the trench 20 serves as the trench insulating film 21. In this manner, the trench insulating film 21 is formed on the inner surface of the trench 20.

Then, a conducting film 53 is deposited, by CVD or the like, for example, on the insulating film 52 in the semiconductor substrate 50 and on the insulating film 52 inside the trench 20 so as to fill the trench 20. The conducting film 53 is a doped poly-silicon film in which phosphorus is doped, for example. Next, the conducting film 53 is etched back to the insulating film 52 by dry etching or the like, for example. In this manner, the trench electrode 22 is formed inside the trench 20 on which the trench insulating film 21 is formed.

After that, the insulating film 52 on the semiconductor substrate 50 outside the trench 20 is removed by wet etching or the like. The trench insulating film 21 thereby remains inside the trench 20. For wet etching, etchant containing hydrofluoric acid, for example, is used.

As shown in FIG. 7, a resist film 51 is formed on the upper surface of the semiconductor substrate 50 and patterned. Then, P type impurities such as boron are introduced on top of the drift layer 10 by ion implantation or the like with use of the patterned resist film 51 as a mask. The body layer 12 is thereby formed on the drift layer 10 between the adjacent trench electrodes 22. Further, N type impurities such as phosphorus are introduced under the body layer 12 by ion implantation or the like with use of the resist film 51 as a mask. The hole barrier layer 11 is thereby formed under the body layer 12. When forming the hole barrier layer 11, deep ion implantation is done at high acceleration (e.g., 500 kev to 2 Mev) in order to prevent the disappearance of a channel to be formed in the body layer 12. The impurity concentration of the hole barrier layer 11 is set higher than the impurity concentration of the drift layer 10. For example, the impurity concentration of the hole barrier layer 11 is made as high as $1 \times 10^{17}$ to $1 \times 10^{18}/cm^3$. After that, the resist film 51 is removed by asking or the like.

As shown in FIG. 8, a patterned resist film 54 is formed. Then, P type impurities such as boron are introduced under the hole barrier layer 11 and above the drift layer 10 by ion implantation or the like with use of the resist film 55 as a mask. The floating layer 28 for electric field reduction is thereby formed on the drift layer 10. When forming the floating layer 28 for electric field reduction, deep ion implantation is done at high acceleration (e.g., 1 Mev to 2 Mev). The floating layer 28 for electric field reduction is formed so that the lower end of the trench electrode 22 is covered with the floating layer 28 for electric field reduction with the trench insulating film 21 interposed therebetween. The impurity concentration of the floating layer 28 for electric field reduction is set lower than the impurity concentration of the body layer 12. For example, the impurity concentration in close proximity to the lower end of the trench 20 is equal to or lower than $1 \times 10^{16}/cm^3$. After that, the resist film 54 is removed by ashing or the like.

As shown in FIG. 9, a patterned resist film 55 is formed. Then, N type impurities such as arsenic are introduced by ion implantation or the like with use of the resist film 55 as a mask. The emitter layer 13 is thereby formed on the body layer 12. After that, the resist film 55 is removed by ashing or the like.

As described above, the floating layer 28 for electric field reduction placed on the drift layer 10 and where the lower end of the trench electrode 22 reaches, the hole barrier layer 11 placed on the floating layer 28 for electric field reduction, the body layer 12 placed on the hole barrier layer 11, and the emitter layer 13 placed on the body layer 12 are formed in the semiconductor substrate 50 in such a way that the emitter layer 13, the body layer 12 and the hole barrier layer 11 are separated from the drift layer 10 by the floating layer 28 for electric field reduction.

Then, as shown in FIG. 10, the inter-layer insulating layer 31 is formed on the semiconductor substrate 50 by CVD or the like, for example. The inter-layer insulating layer 31 contains a silicon oxide film such as a PSG (Phosphsilicate Glass) film, for example. Note that, besides the PSG film, a BPSG (Borophosphsilicate Glass) film, an NSG (Non-doped Silicate Glass) film, an SOG (Spin-On-Glass) film or a composite film of those may be used for the inter-layer insulating layer 31.

On the inter-layer insulating layer 31, a patterned resist film or the like, which is not shown, is formed. Using the patterned resist film or the like, the through groove 33 is made in the inter-layer insulating layer 31 by anisotropic dry etching, for example. The through groove 33 that runs through the inter-layer insulating layer 31 formed the semiconductor substrate 50 is made in this manner.

After that, the unneeded resist film is removed by asking or the like. Then, the contact groove 30 that communicates with the through groove 33 and reaches the body layer 12 is formed by anisotropic dry etching with use of the inter-layer insulating layer 31, for example.

A contact layer 35 is formed on the body layer 12 by ion implantation of P type impurities through the through groove 33 and the contact groove 30, for example.

After that, a metal layer such as aluminum is formed, by sputtering or the like, on the inter-layer insulating layer 31 and inside the through groove 33 and the contact groove 30, for example, so as to connect with the body layer 12. The emitter line layer 32 is thereby formed on the inter-layer insulating layer 31. The contact 34 is formed inside the through groove 33 and the contact groove 30.

As described above, the emitter line layer 32 that connects with the body layer 12 through the through groove 33 and the contact groove 30 is formed on the inter-layer insulating layer 31. Note that, before forming the metal layer, a barrier metal film may be formed on the inter-layer insulating layer 31, on the inner surface of the through groove 33, and on the inner surface of the contact groove 30.

Further, a field stop layer and a collector layer are formed below the drift layer 10. Furthermore, a collector line layer in contact with the collector layer is formed. The semiconductor device 1 is thereby manufactured.

Advantageous effects of the first embodiment are described hereinbelow.

In the semiconductor device 1 according to this embodiment, the floating layer 28 for electric field reduction is formed immediately below the hole barrier layer 11. It is thereby possible to reduce the strength of the electric field between the hole barrier layer 11 and the body layer 12. Further, the lower end of the trench 20 is covered with the floating layer 28 for electric field reduction. It is thereby possible to reduce the strength of the electric field at the lower end of the trench 20.

Further, because the floating layer 28 for electric field reduction is formed immediately below the hole barrier layer 11, the impurity concentration of the hole barrier layer 11 can be high. It is thus possible to maximize the hole barrier effects while maintaining the withstand voltage, and thereby reduce the saturation voltage Vce(sat).

In an existing method to reduce the saturation voltage Vce(sat), the hole barrier layer 11 is formed immediately below the body layer 12 so as to suppress holes from being injected into the emitter line layer 32. This increases the carrier density. It has been considered that the saturation voltage Vce(sat) can be further reduced by increasing the impurity concentration of the hole barrier layer 11 in such a case. However, merely increasing the impurity concentration of the hole barrier layer 11 causes an increase in the strength of the electric field at the interface between the body layer 12 and the hole barrier layer 11, which can reduce the collector-emitter withstand voltage. Therefore, it has not been possible to increase the impurity concentration of the hole barrier layer 11.

On the other hand, in the semiconductor device 1 according to this embodiment, because the floating layer 28 for electric field reduction is formed immediately below the hole barrier layer 11, the strength of the electric field between the hole barrier layer 11 and the body layer 12 can be reduced, and it is thereby possible to increase the impurity concentration of the hole barrier layer 11. This achieves reduction of the saturation voltage Vce(sat).

Note that, it is considered that, if the lower end of the trench 20 is covered with the floating layer 28 for electric field reduction, the path of a channel is blocked, and the current by electrons ceases to flow. However, by lowering the concentration of impurities contained in the floating layer 28 for electric field reduction, the electrons can pass through it. Specifically, the carrier passes through the non-inverted region of the floating layer 28 for electric field reduction.

Second Embodiment

Figure 12:
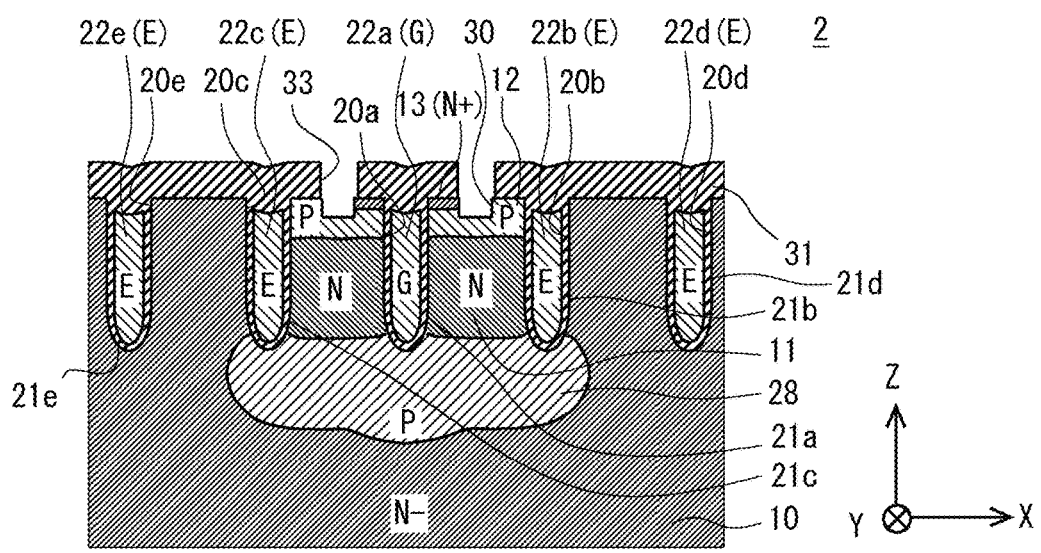
FIG. 12 is a cross-sectional view illustrating a semiconductor device according to a second embodiment.

A semiconductor device according to a second embodiment is described hereinafter. In the second embodiment, the trench electrode 22 is added in the +X axis direction and the −X axis direction to the trench electrodes 22a to 22c in the first embodiment. FIG. 12 is a cross-sectional view illustrating the semiconductor device according to the second embodiment.

As shown in FIG. 12, in a semiconductor device 2, the second trench electrodes E are additionally placed on one side of the second trench electrode E placed on one side and on the other side of the second trench electrode E placed on the other side, so that the first trench electrode G and the second trench electrodes E placed on both sides of the first trench electrode G are placed between the additionally placed second trench electrodes E.

To be specific, in the semiconductor device 2, the plurality of trench electrodes 22 are placed side by side in the X axis direction. The trench electrode 22e, the trench electrode 22c, the trench electrode 22a, the trench electrode 22b and the trench electrode 22d are placed sequentially toward the +X axis direction. Those trench electrodes 22 correspond to the second trench electrode E, the second trench electrode E, the first trench electrode G, the second trench electrode E and the second trench electrode E, respectively. The lower ends of the additionally placed second trench electrodes E, which are the lower end of the trench electrode 22d and the lower end of the trench electrode 22e, are not covered with the floating layer 28 for electric field reduction.

In this embodiment, by adding the second trench electrodes E to the structure of the first embodiment, it is possible to further reduce the strength of the electric field at the lower end of the first trench electrode G and thereby improve the withstand voltage. The other structure and effects are included in the description of the first embodiment.

Third Embodiment

Figure 13:
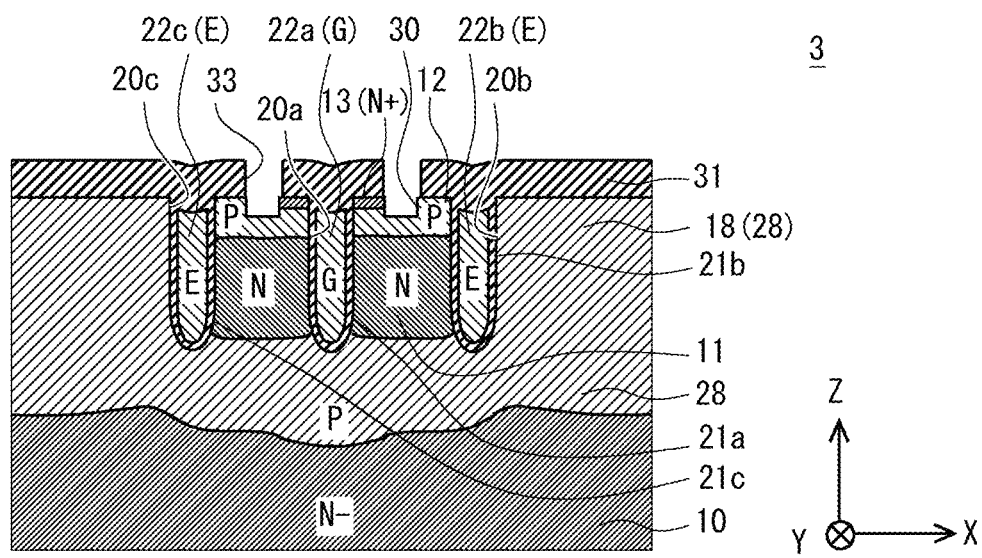
FIG. 13 is a cross-sectional view illustrating a semiconductor device according to a third embodiment.

A semiconductor device according to a third embodiment is described hereinafter. In the third embodiment, one side and the other side of the second trench electrodes E according to the first embodiment are covered with a floating layer 18 for carrier storage. FIG. 13 is a cross-sectional view illustrating the semiconductor device according to the third embodiment.

As shown in FIG. 13, in a semiconductor device 3, the second trench electrodes E are placed on both of one side (+X axis direction side) and the other side (−X axis direction side) of the first trench electrode G, so that the first trench electrode G is placed between the second trench electrodes E. The floating layer 18 for carrier storage is formed on the drift layer 10 on one side of the second trench electrode E (the trench electrode 22b) placed on one side and on the other side of the second trench electrode E (the trench electrode 22c) placed on the other side. Thus, the floating layer 28 for electric field reduction is placed along the lower ends of the first trench electrode G and the second trench electrodes E on both sides of the first trench electrode G and is connected with the floating layer 18 for carrier storage.

Note that the floating layer 28 for electric field reduction and the floating layer 18 for carrier storage may be formed as the same floating layer. Specifically, they may be floating layers having substantially the same impurity concentration and conductivity type. The floating layer is a collective term, which is not limited to the floating layer 28 for electric field reduction or the floating layer 18 for carrier storage.

To be specific, the floating layer is placed along the side of the trench electrodes 22b in the +X axis direction, the side of the trench electrode 22c in the −X axis direction, the lower end of the trench electrode 22c and the lower end of the trench electrodes 22b, so as to surround the region from the trench electrodes 22c to the trench electrodes 22b. The floating layer that is placed on the +X axis direction side of the trench electrodes 22b and on the −X axis direction side of the trench electrode 22c is the floating layer 18 for carrier storage.

According to this embodiment, both of the floating layer 18 for carrier storage, which has been used also in related art, and the floating layer 28 for electric field reduction are formed. It is thereby possible to further reduce the strength of the electric field at the lower end of the trench electrodes 22 and thereby improve the withstand voltage. The other structure and effects are included in the description of the first and second embodiments.

Fourth Embodiment

Figure 14:
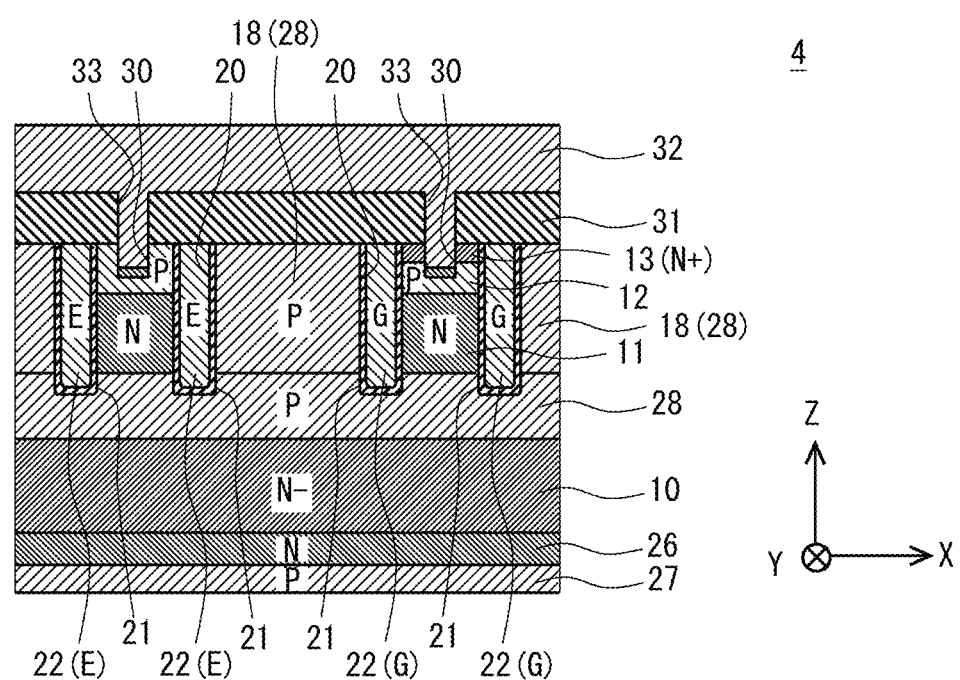
FIG. 14 is a cross-sectional view illustrating a semiconductor device according to a fourth embodiment.

A semiconductor device according to a fourth embodiment is described hereinafter. In the fourth embodiment, the first trench electrodes G adjacent to each other and the second trench electrodes E adjacent to each other are placed. FIG. 14 is a cross-sectional view illustrating the semiconductor device according to the fourth embodiment.

As shown in FIG. 14, in a semiconductor device 4, a plurality of first trench electrodes G and a plurality of second trench electrodes E are placed, and the first trench electrodes G that are adjacent to each other and the second trench electrodes E that are adjacent to each other are placed. Between the adjacent first trench electrodes G, the emitter layer 13, the body layer 12 and the hole barrier layer 11 are placed. Between the adjacent second trench electrodes E, the body layer 12 and the hole barrier layer 11 are placed. The floating layer 28 for electric field reduction is placed along the lower ends of the adjacent first trench electrodes G and the adjacent second trench electrodes E.

When viewed from one first trench electrode G of the adjacent first trench electrodes G, the floating layer 18 for carrier storage is placed on an side opposite to the side where the emitter layer 13, the body layer 12 and the hole barrier layer 11 are placed.

When viewed from one second trench electrode E of the adjacent second trench electrodes E, the floating layer 18 for carrier storage is placed on an side opposite to the side where the body layer 12 and the hole barrier layer 11 are placed. A field stop layer 26 is placed below the drift layer 10, and a collector layer 27 is placed below the field stop layer 26.

According to this embodiment, because the floating layer 28 for electric field reduction is placed along the lower ends of the adjacent first trench electrodes G and the adjacent second trench electrodes E, it is possible to reduce the strength of the electric field at the lower end of each trench electrode 22 and thereby improve the withstand voltage. The other structure and effects are included in the description of the first to third embodiments.

Fifth Embodiment

Figure 15:
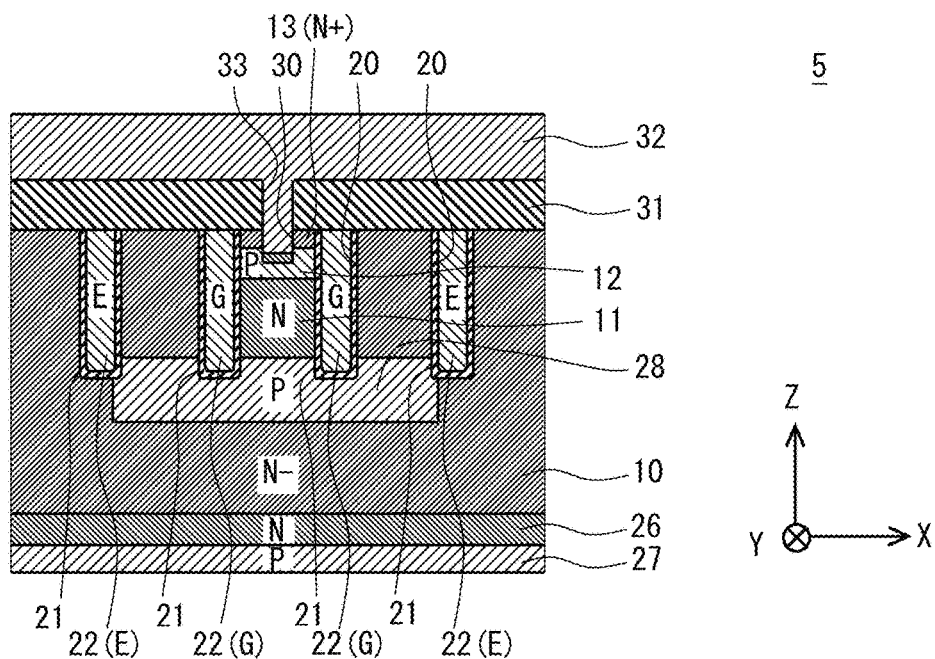
FIG. 15 is a cross-sectional view illustrating a semiconductor device according to a fifth embodiment.

A semiconductor device according to a fifth embodiment is described hereinafter. In the fifth embodiment, the first trench electrodes G adjacent to each other, and the second trench electrodes E on one side and the other side of the adjacent first trench electrodes G are placed. FIG. 15 is a cross-sectional view illustrating the semiconductor device according to the fifth embodiment.

As shown in FIG. 15, in a semiconductor device 5, a plurality of first trench electrodes G and a plurality of second trench electrodes E are placed. Between the adjacent first trench electrodes G, the emitter layer 13, the body layer 12 and the hole barrier layer 11 are placed. The second trench electrodes E are placed on both of one side (+X axis direction side) and the other side (−X axis direction side) of the adjacent first trench electrodes G, so that the adjacent first trench electrodes G are placed between the second trench electrodes E. The floating layer 28 for electric field reduction is placed along the lower ends of the adjacent first trench electrodes G and a part of the lower ends of the second trench electrodes E on both sides of the adjacent first trench electrodes G.

According to this embodiment, because the second trench electrodes E are placed on both of one side and the other side of the adjacent first trench electrodes G so that the adjacent first trench electrodes G are placed therebetween, it is possible to reduce the strength of the electric field at the lower ends of the adjacent first trench electrodes G. Further, because the floating layer 28 for electric field reduction is placed along the lower ends of the adjacent first trench electrodes G and a part of the lower ends of the second trench electrodes E on both sides of the adjacent first trench electrodes G, it is thereby possible to reduce the strength of the electric field at the lower end of each trench electrode 22.

The other structure and effects are included in the description of the first to fourth embodiments.

Sixth Embodiment

Figure 16:
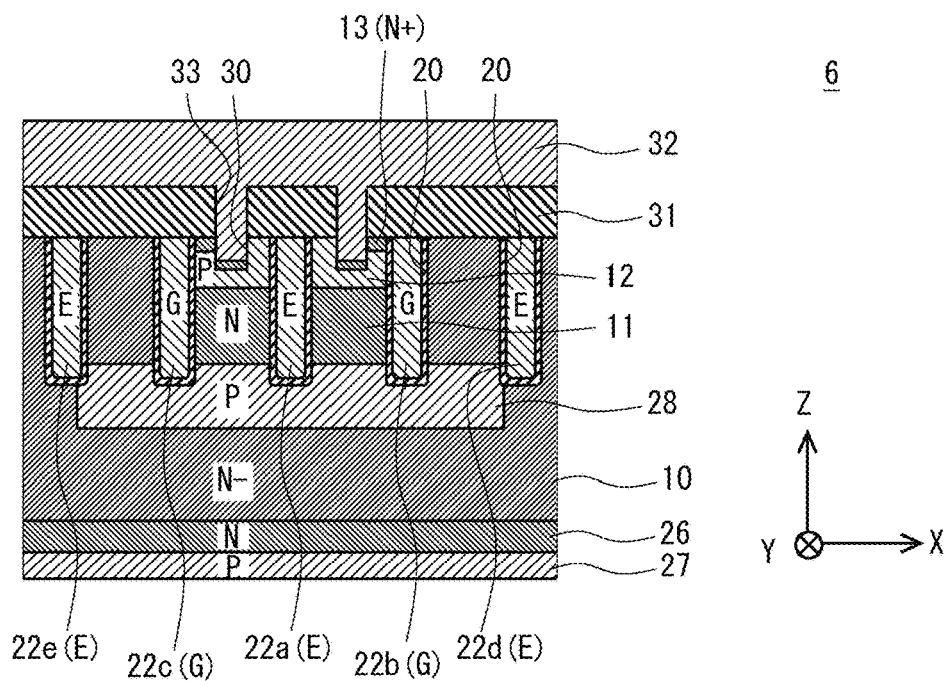
FIG. 16 is a cross-sectional view illustrating a semiconductor device according to a sixth embodiment.

A semiconductor device according to a sixth embodiment is described hereinafter. In the sixth embodiment, the first trench electrodes G (the trench electrodes 22b and 22c) and the second trench electrodes E (the trench electrodes 22d and 22e) are placed on both of one side and the other side of the specified second trench electrode E (the trench electrodes 22a) at the center. FIG. 16 is a cross-sectional view illustrating the semiconductor device according to the sixth embodiment.

As shown in FIG. 16, in a semiconductor device 6, a plurality of first trench electrodes G and a plurality of second trench electrodes E are placed. The first trench electrodes G (the trench electrodes 22b and 22c) are placed on one side and the other side of the specified second trench electrode E (the trench electrodes 22a).

Further, the second trench electrodes E (the trench electrodes 22d and 22e) are placed on one side (+X axis direction side) of the first trench electrode G (the trench electrodes 22b) located on one side (+X axis direction side) and on the other side (−X axis direction side) of the first trench electrode G (the trench electrodes 22c) located on the other side (−X axis direction side).

Between the specified second trench electrode E (the trench electrodes 22a) and the first trench electrode G (the trench electrodes 22b) located on one side and between the specified second trench electrode E (the trench electrodes 22a) and the first trench electrode G (the trench electrodes 22c) located on the other side, the emitter layer 13, the body layer 12 and the hole barrier layer 11 are placed.

The floating layer 28 for electric field reduction is placed along the lower end of the specified second trench electrode E (the trench electrodes 22a) and the lower ends of the first trench electrodes G (the trench electrodes 22b and 22c) on one side and the other side. Further, the floating layer 28 for electric field reduction coverts a part of the lower end of the second trench electrode E (the trench electrodes 22d) placed on one side of the first trench electrode G (the trench electrodes 22b) located on one side and a part of the lower end of the second trench electrode E (the trench electrodes 22e) placed on the other side of the first trench electrode G (the trench electrodes 22c) located on the other side. For example, the floating layer 28 for electric field reduction is in contact with the lower end of the trench electrodes 22d and the lower end of the trench electrodes 22e.

According to this embodiment, because the floating layer 28 for electric field reduction is placed along the lower end of the specified second trench electrode E and the lower ends of the first trench electrodes G on one side and the other side, it is possible to reduce the strength of the electric field at the lower end of each trench electrode 22. Further, because the floating layer 28 for electric field reduction is in contact with the lower end of the trench electrodes 22d and the lower end of the trench electrodes 22e, the occurrence of snapback can be suppressed. The other structure and effects are included in the description of the first to fifth embodiments.

Seventh Embodiment

Figure 17:
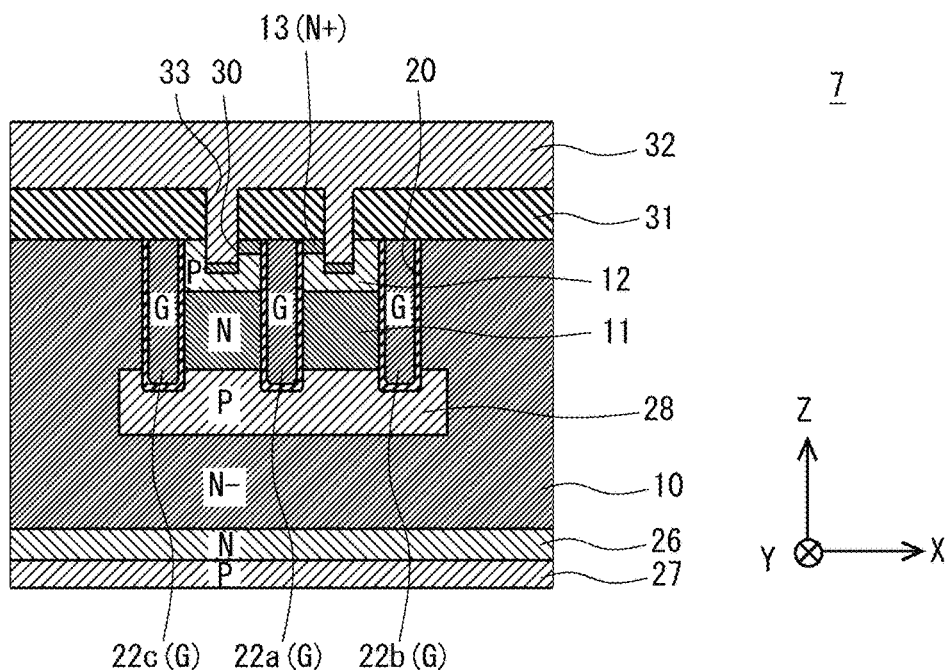
FIG. 17 is a cross-sectional view illustrating a semiconductor device according to a seventh embodiment.

A semiconductor device according to a seventh embodiment is described hereinafter. In the seventh embodiment, the first trench electrodes G (the trench electrodes 22b and 22c) are placed on both of one side and the other side of the specified first trench electrode G (the trench electrodes 22a) at the center. FIG. 17 is a cross-sectional view illustrating the semiconductor device according to the seventh embodiment.

As shown in FIG. 17, in a semiconductor device 7, the first trench electrodes G (the trench electrodes 22b and 22c) are placed on one side (+X axis direction side) and the other side (−X axis direction side) of the specified first trench electrode G (the trench electrodes 22a). Between the specified first trench electrode G (the trench electrodes 22a) and the first trench electrode G (the trench electrodes 22b) located on one side and between the specified first trench electrode G (the trench electrodes 22a) and the first trench electrode G (the trench electrodes 22c) located on the other side, the emitter layer 13, the body layer 12 and the hole barrier layer 11 are placed. The floating layer 28 for electric field reduction is placed along the lower end of the specified first trench electrode G (the trench electrodes 22a) and the lower ends of the first trench electrodes G (the trench electrodes 22b and 22c) on one side and the other side.

According to this embodiment, even when the first trench electrode G is placed on one side and the other side of the first trench electrode G, it is possible to reduce the strength of the electric field at the lower end of each trench electrode 22. The other structure and effects are included in the description of the first to sixth embodiments.

Eighth Embodiment

Figure 18:
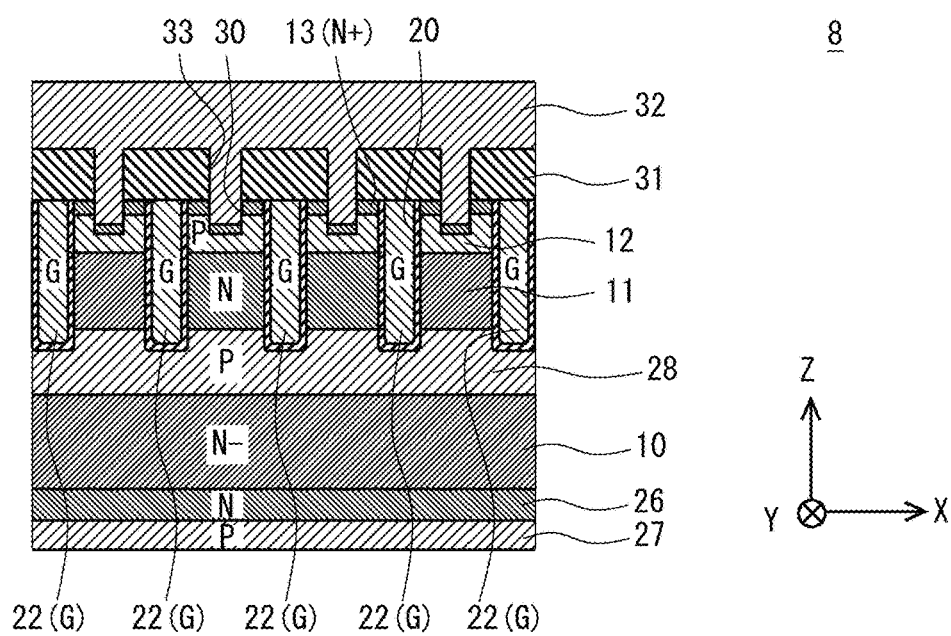
FIG. 18 is a cross-sectional view illustrating a semiconductor device according to an eighth embodiment.
Figure 19:
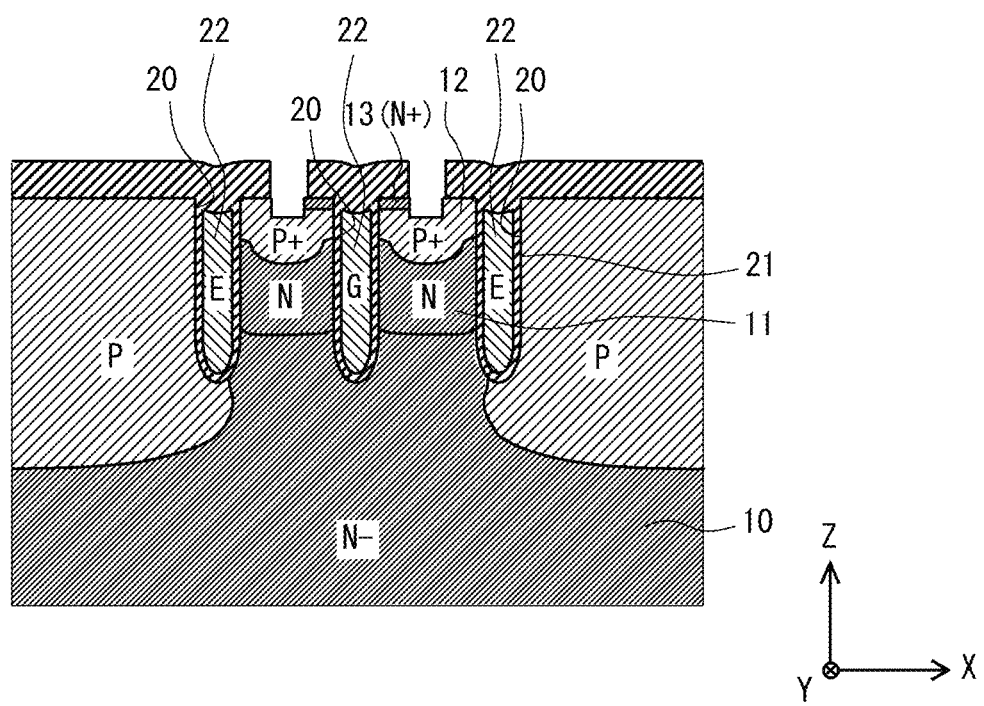
FIG. 19 is a cross-sectional view illustrating a semiconductor layer of an IGBT.

A semiconductor device according to an eighth embodiment is described hereinafter. In the eighth embodiment, a plurality of first trench electrodes G are arranged side by side. FIG. 18 is a cross-sectional view illustrating the semiconductor device according to the eighth embodiment.

As shown in FIG. 18, in a semiconductor device 8, a plurality of first trench electrodes G are arranged side by side. Between the first trench electrodes G adjacent to each other among the plurality of first trench electrodes G arranged side by side, the emitter layer 13, the body layer 12 and the hole barrier layer 11 are placed. The floating layer 28 for electric field reduction is placed along the lower end of each of the first trench electrodes G.

According to this embodiment, even when a plurality of first trench electrodes G are arranged side by side, it is possible to reduce the strength of the electric field at the lower end of each trench electrode 22. The other structure and effects are included in the description of the first to seventh embodiments.

Although the invention accomplished by the present inventor is specifically described using several embodiments in the foregoing, the present invention is not restricted to the above-described embodiments, and various changes and modifications may be made without departing from the scope of the invention.

The first to the eighth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
a semiconductor substrate having an upper surface;
a first trench electrode placed inside a first trench formed on the upper surface;
a second trench electrode placed inside a second trench formed on the upper surface;
a third trench electrode placed inside a third trench formed on the upper surface;
a first trench insulating film placed between the first trench electrode and the semiconductor substrate;
a second trench insulating film placed between the second trench electrode and the semiconductor substrate; and
a third trench insulating film placed between the third trench electrode and the semiconductor substrate,
wherein the semiconductor substrate includes:
   a first semiconductor layer of a first conductivity type,
   a floating layer of a second conductivity type placed on the first semiconductor layer, a lower end of each of the first, second and third trench electrodes reaching the floating layer,
   a barrier layer of the first conductivity type placed on the floating layer and being in contact with the first, second and third trench insulating films,
   a second semiconductor layer of the second conductivity type placed on the barrier layer and being in contact with the first, second and third trench insulating films, and
   a third semiconductor layer of the first conductivity type placed on the second semiconductor layer,
wherein the third semiconductor layer, the second semiconductor layer and the barrier layer are separated from the first semiconductor layer by the floating layer,
wherein a path of a carrier passing through an inverted layer formed in the second semiconductor layer includes the second semiconductor layer, the barrier layer, a non-inverted region of the floating layer, and the first semiconductor layer,
wherein a gate voltage is applied to the first trench electrode for forming an inverted region in a part of the second semiconductor layer in contact with the trench insulating film,
wherein an emitter voltage is applied to the second and third trench electrodes for establishing continuity between the first semiconductor layer and the third semiconductor layer, and
wherein the lower end of each of the first, second and third trench electrodes is covered with the floating layer via each of the first, second and third trench insulating films such that the first, second and third trench insulating films are directly in contact with the floating layer.

2. The semiconductor device according to claim 1,
wherein the first trench electrode is arranged between the second trench electrode and the third trench electrode, and
wherein the third semiconductor layer, the second semiconductor layer and the barrier layer are arranged between the first trench electrode and the second trench electrode, and between the first trench electrode and the third trench electrode.

3. The semiconductor device according to claim 2, further comprising:
a fourth trench electrode placed inside a fourth trench formed on the upper surface;
a fifth trench electrode placed inside a fifth trench formed on the upper surface;
a fourth trench insulating film placed between the fourth trench electrode and the semiconductor substrate; and
a fifth trench insulating film placed between the fifth trench electrode and the semiconductor substrate,
wherein the second trench electrode is arranged between the fourth trench electrode and the first trench electrode,
wherein the third trench electrode is arranged between the fifth trench electrode and the first trench electrode, and
wherein the fourth and fifth trench electrodes are not covered with the floating layer.

4. The semiconductor device according to claim 2,
wherein side surface of the second trench electrode, positioned opposite to the first trench electrode, is covered with the floating layer via the second trench insulating film, and
wherein side surface of the third trench electrode, positioned opposite to the first trench electrode, is covered with the floating layer via the third trench insulating film.

5. The semiconductor device according to claim 1, wherein impurity concentration of the barrier layer is higher than impurity concentration of the first semiconductor layer.

6. The semiconductor device according to claim 1, wherein impurity concentration of the floating layer is lower than impurity concentration of the second semiconductor layer.

* * * * *